United States Patent [19]

Hovel et al.

[11] 4,276,137
[45] Jun. 30, 1981

[54] CONTROL OF SURFACE RECOMBINATION LOSS IN SOLAR CELLS

[75] Inventors: Harold J. Hovel, Katonah; Jerry M. Woodall, Bedford Hills, both of N.Y.

[73] Assignee: International Business Machines Corporation, Armonk, N.Y.

[21] Appl. No.: 59,855

[22] Filed: Jul. 23, 1979

[51] Int. Cl.³ .............................................. H01L 31/18
[52] U.S. Cl. .................................. 204/164; 136/256; 136/262; 357/30; 357/52; 427/74
[58] Field of Search ...... 136/89 CC, 89 GA, 256 CC, 136/262 GA; 357/30, 52; 427/74; 204/164

[56] References Cited

U.S. PATENT DOCUMENTS

| | | | |
|---|---|---|---|
| 3,620,829 | 11/1971 | Beck | 136/89 CC |
| 3,675,026 | 7/1972 | Woodall | 250/211 J |
| 3,993,506 | 11/1976 | Moon | 136/89 |
| 4,105,471 | 8/1978 | Yerkes et al. | 136/89 CC |
| 4,144,094 | 3/1979 | Coleman et al. | 136/89 CC |

OTHER PUBLICATIONS

R. P. H. Chang et al., "A New Method of Fabricating Gallium Arsenide MOS Devices", Appl. Phys. Lett., vol. 32, pp. 332-333 (1978).
H. J. Hovel et al., "Improved GaAs Solar Cells With Very Thin Junctions", Conf. Record, 12th IEEE Photovoltaic Specialists Conf. (1976), pp. 945-947.
R. P. H. Chang et al., "Plasma Oxidation of GaAs", Appl. Phys. Lett., vol. 29, pp. 56-58 (1976).

Primary Examiner—Aaron Weisstuch
Attorney, Agent, or Firm—Alvin J. Riddles

[57] ABSTRACT

Surface recombination in solar cells that is produced by band bending at the surface of the semiconductor which is in turn caused by defect states which pin the Fermi level at the surface, may be improved by applying a surface layer which may be a plasma oxide that has been hydrogen annealed and this layer may also be useful as an antireflecting coating.

1 Claim, 9 Drawing Figures

4,276,137

CONTROL OF SURFACE RECOMBINATION LOSS IN SOLAR CELLS

DESCRIPTION

Technical Field

The technical field of the invention is semiconductor solar cells. In these cells, light which strikes a surface is converted to minority carriers in the semiconductor which are collected at a p-n junction to produce a current. One fundamental problem with such cells is that the energy bands in the semiconductor material are bent at the surface, such that the Fermi level at the surface is near the middle of the energy gap. This produces a lower energy level for minority at the surface and enhances surface recombination loss. This energy band bending related loss has become known in the art as "Fermi Level Pinning".

BACKGROUND ART

There have been approaches in the art for providing a region at the surface of a solar cell which provides minimum attenuation of the photons of light while at the same time improving the situation involving the "Fermi Level Pinning" phenomenon. One example of such an approach is U.S. Pat. No. 3,675,026 in which a p-type layer of gallium aluminum arsenide covers the p-n gallium arsenide device and reduces losses by providing a lattice-matched expitaxial layer.

Heretofore in the art, however, there has been a limitation to such structures in that the layers themselves have a tendency to absorb some of the solar photons that have energies that are higher than the bandgap of the particular cover layer.

DISCLOSURE OF THE INVENTION

The invention involves a surface region that operates to change the energy band relationship at the surface of a semiconductor solar cell such as a gallium arsenide or gallium aluminum arsenide solar cell to thereby remove the losses in such a device caused by minority carriers in the vicinity of the surface finding an adjacent lower energy level at the surface rather than migrating to the p-n junction of the device.

Semiconductor surfaces often contain native oxides which produce surface states which lie between the conduction and valence band and whose density is sufficient to pin the Fermi energy level between said conduction and valence bands, which causes surface recombination losses for solar cell structures. Examples of materials with such surfaces are GaAs and CdTe, whose native oxides meet this criterion. However, an improved native oxide surface layer can be provided by plasma oxidation which is followed by a hydrogen annealing step. The combination of these two steps operate to change the relationship of the energy diagram with respect to the Fermi level at the surface and to thereby reduce the losses in the device due to surface recombination.

Best Mode For Carrying Out the Invention

Figure 1:
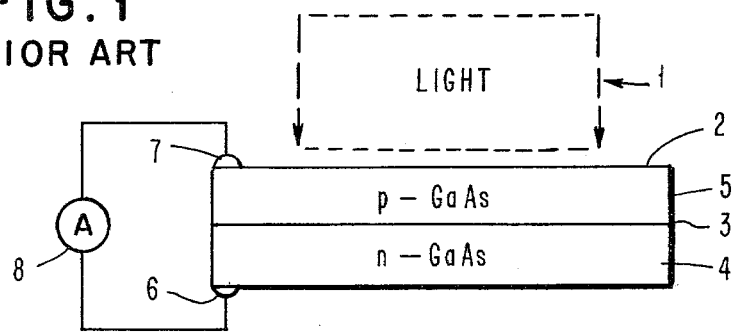
FIG. 1 is a prior art illustration of a p-n gallium arsenide solar cell.

Referring to FIG. 1 there is illustrated a typical prior art type of semiconductor photocell wherein light 1 is caused to impinge on a surface 2 of a body of semiconductor material containing a p-n junction 3. The body is shown as having an n-conductivity type region 4 of gallium arsenide and a p-conductivity region 5 of gallium arsenide. The n-region 4 is equipped with a contact 6 and the p-region 5 is equipped with a contact 7 and a current indicating device shown as a meter 8, is connected between them.

The device of FIG. 1 operates by photons of light 1 striking the p-region 5 and forming minority carriers which proceed to the p-n junction 3 and appear as an external current in the meter 8.

Devices of this type are characterized by a number of losses and in order to raise the overall efficiency of the device, efforts are made to address each loss. One type of loss that has been fundamental to such devices has been influenced by the energy states of the semiconductor right at the surface 2.

Figure 2:
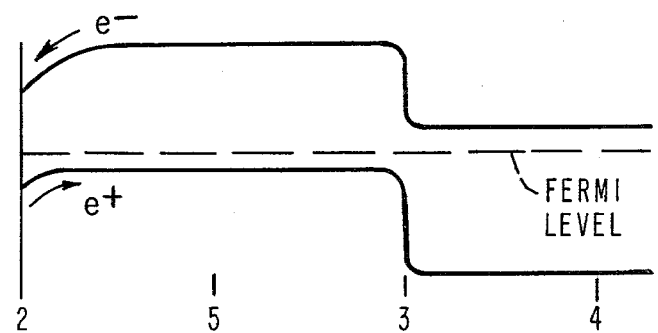
FIG. 2 is an energy band diagram of the energy bands at the surface of the device of FIG. 1.

Referring next to FIG. 2 there is shown an energy band diagram of the semiconductor wherein reference numerals are shown that correspond to regions of the structure of FIG. 1. It may be seen in FIG. 2 that the energy level in the region 5 turns sharply in the direction of the Fermi level at the surface 2 and this is a fundamental loss mechanism in a device of this type in that there is a lower energy level for a minority carrier produced by a photon causing it to migrate in the direction of the surface rather than in the direction of the p-n junction. This band bending at the surface, also known as the "Fermi Level Pinning" phenomenon, is caused by a high density of surface energy states located at the surface 2.

Figure 3:
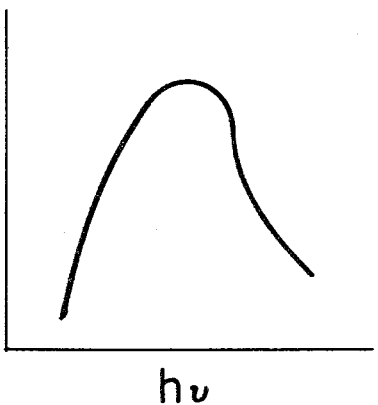
FIG. 3 is a graph of the short circuit current versus the light frequency of the device of FIG. 1.

In FIG. 3 a graph is shown on the short circuit current output of the device of FIG. 1 with respect to the light energy wherein it is indicated that as the light energy increases, the surface recombination caused by the "Fermi Level Pinning" phenomenon, shown in FIG. 2, operates to drop the short circuit current.

In accordance with the invention a surface layer is applied to the structure of FIG. 1 which operates to change the "Fermi Level Pinning" phenomenon at that surface. The Fermi Level is unpinned, and the band bending reduced, because the density of surface energy states is greatly reduced.

Figure 4:
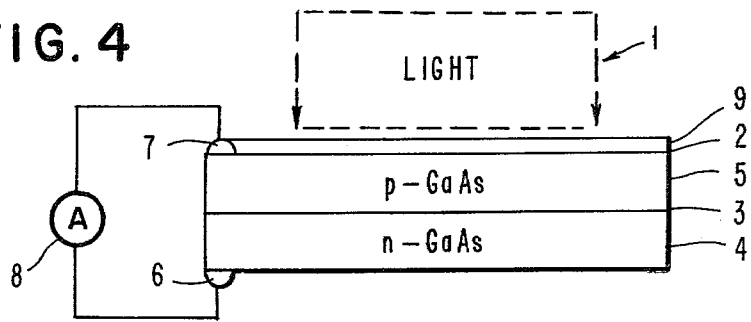
FIG. 4 is a solar cell structure showing the surface region in accordance with the invention.

In FIG. 4 the numerals of corresponding items to FIG. 1 are the same and a region 9 is provided over the surface of the gallium arsenide region 5.

In accordance with the invention, the region 9 has the characteristics that by its optical properties, it operates not to attenuate the light while changing the energy level at the surface 2. These characteristics can be provided by a low temperature plasma oxide of the surface 2 which is followed by an annealing in hydrogen gas. The plasma oxidized region does not absorb the light between 0.3 and 2 micron wavelengths and hence, the oxide will not attenuate the light from reaching the surface 2.

Figure 5:
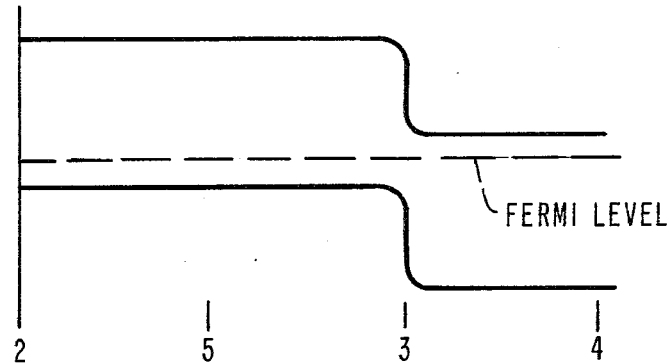
FIG. 5 is an energy band diagram of the device of FIG. 4.
Figure 6:
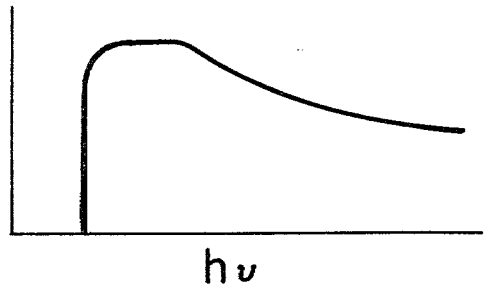
FIG. 6 is a graph showing the short circuit current of the device of FIG. 4 versus light energy.

The resulting energy band diagram of the device in FIG. 4 is shown in FIG. 5 where it is seen that the band bending has been eliminated, i.e., the Fermi level is no longer pinned at the surface. The short circuit current versus light energy is greatly improved as seen in FIG. 6. There is, however, still some loss at high energies due to poor diffusion lengths and the remaining surface recombination.

Figure 7:
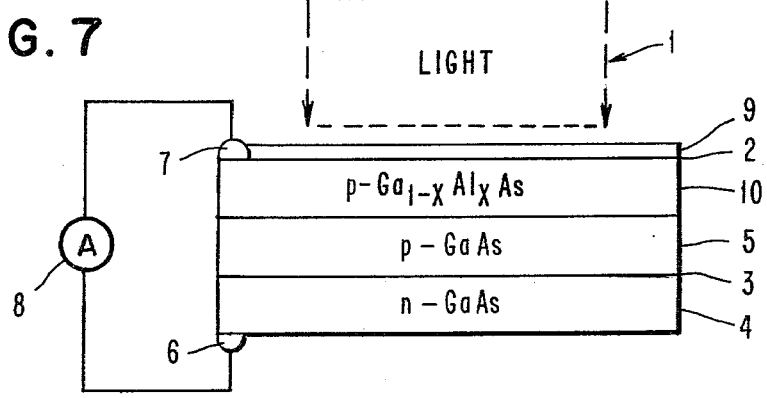
FIG. 7 is another solar cell structure showing the surface region in accordance with the invention.
Figure 8:
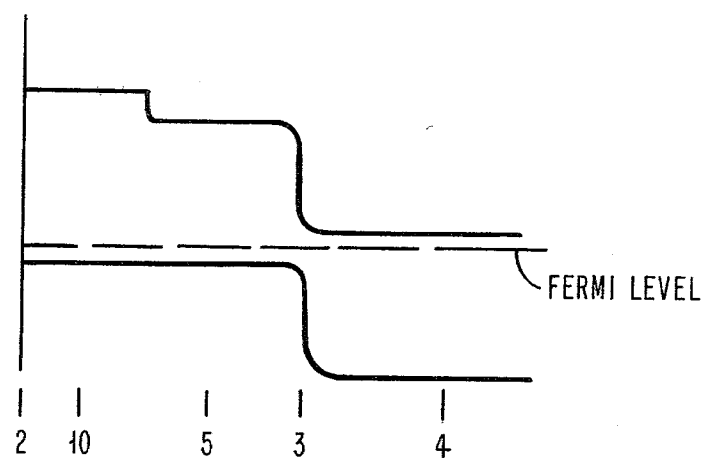
FIG. 8 is an energy band diagram of the device of FIG. 7.

An alternate structure is shown in FIG. 7 wherein again comparable reference numerals to FIGS. 1 and 4 have been employed but in the alternate structure of FIG. 7, a region 10 of p-type $Ga_{1-x}Al_xAs$ is employed with the surface region 9 over the gallium aluminum arsenide region 10. The structure of FIG. 7 without the region 9 is a well known highly efficient solar device but the efficiency is still limited by surface recombination losses due to the band bending near the surface. The addition of the surface region 9 together with hydrogen annealing can prevent this surface recombination loss. The energy band diagram of the device of FIG. 7 is shown in FIG. 8. In similarity to the device of FIG. 4 and its corresponding energy band diagram in FIG. 5, there is no band bending at the surface 2 in FIG. 8, and therefore the "Fermi Level Pinning" problem has been solved.

Figure 9:
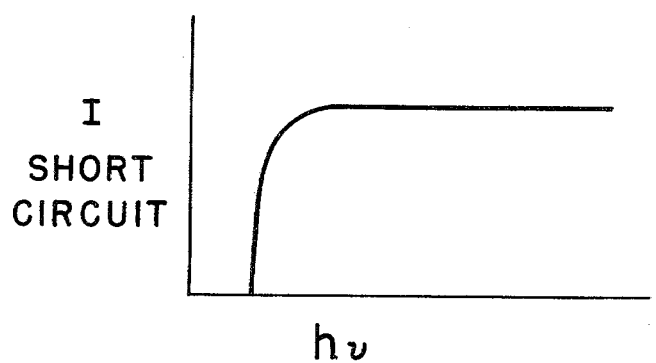
FIG. 9 is a graph showing the short circuit current of the device of FIG. 7 versus light energy.

Referring next to FIG. 9 a graph of the short circuit current versus light energy is shown and in this diagram the short circuit current no longer falls off with increased light energy. The $Ga_{1-x}Al_xAs$ layer combined with the removal of Fermi Level pinning has eliminated virtually all the losses due to surface effects.

In accordance with the invention, the region 9 may be formed in the following manner. The device is mounted on an anode in a vacuum system with surface 2 exposed. A source of oxygen is introduced into the system at a pressure of $10^{-3}$ to $10^{-2}$ torr. An RF electric field is then used to ionize the oxygen while the anode is biased at 30–100 volts positive.

Under these conditions a plasma oxidation is carried out for 1 to 3 minutes which will produce a 700–1000 Å thick native oxide film on the surface 2. The device is then removed from the vacuum system and placed in a system for annealing in the presence of $H_2$ at 400°–500° C. for a period of time from 15 minutes to 1 hour.

A particularly advantageous feature of the invention is that the layer 9 can also have optical properties for antireflection purposes by choosing the thickness of the layer 9 such that in accordance with its refractive index it forms a quarter wavelength optical coating.

As another embodiment of this invention in connection with the formation of an antireflection coating while practicing the process above, a 100 Å thick layer of aluminum may be deposited over the surface 2, prior to mounting the sample in the vacuum system. Under these circumstances, when the plasma oxide is formed, a layer of aluminum oxide is formed over the native oxide surface. The plasma-formed aluminum oxide and the plasma-formed native oxide together form the layer 9. The hydrogen anneal step is then carried out as above. The aluminum oxide layer aids both in passivating the surface 2 and in forming an antireflective coating.

What has been described is a technique of reducing the characteristic loss in a solar cell that occurs because of the band bending caused by Fermi level pinning at the surface, by providing a surface region that is employed to reduce the loss and yet may be equipped with antireflecting optical properties.

Having described the invention, what is claimed as new and what is desired to secure by letters patent is:

1. The process of fabricating a solar cell comprising in combination:

providing a monocrystalline GaAs semiconductor solar cell device body with a light receiving surface and having a p-n junction essentially parallel to said light receiving surface;

providing a layer of GaAlAs on said light receiving surface;

depositing a layer of aluminum over said GaAlAs layer of the order of 100 Å thick;

oxidizing said device body as the anode in an RF field of the order of 30 to 100 volts positive in an evacuated environment containing oxygen at a pressure of the order of $10^{-3}$ to $1^{-2}$ Torr for a time sufficient to form an oxide layer from said GaAlAs layer of the order of 700 to 1000 Å thick covered by an aluminum oxide layer; and annealing said device body in the presence of hydrogen at a temperature of the order of 400° to 500° C. for a period of the order of 15 minutes to 1 hour.

* * * * *

UNITED STATES PATENT AND TRADEMARK OFFICE
CERTIFICATE OF CORRECTION

PATENT NO. : 4,276,137
DATED : June 30, 1981
INVENTOR(S) : Harold J. Hovel and Jerry M. Woodall It is certified that error appears in the above—identified patent and that said Letters Patent are hereby corrected as shown below:

Column 1, line 15, after "minority" insert --carriers--.

Column 2, line 49, "on" should read --of--.

Column 4, line 41, "$1^2$" should read --$10^2$--.

Signed and Sealed this

Twenty-fourth Day of November 1981

[SEAL]

Attest:

GERALD J. MOSSINGHOFF

Attesting Officer     Commissioner of Patents and Trademarks